(12) United States Patent
Otsuki

(10) Patent No.: US 7,696,082 B2
(45) Date of Patent: Apr. 13, 2010

(54) SEMICONDUCTOR DEVICE MANUFACTURING METHOD, SEMICONDUCTOR DEVICE, AND WIRING BOARD

(75) Inventor: Tetsuya Otsuki, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 112 days.

(21) Appl. No.: 12/015,970

(22) Filed: Jan. 17, 2008

(65) Prior Publication Data
US 2008/0174012 A1  Jul. 24, 2008

(30) Foreign Application Priority Data
Jan. 23, 2007  (JP) .............................. 2007-012741

(51) Int. Cl.
*H01L 21/44* (2006.01)
*H01L 21/00* (2006.01)
(52) U.S. Cl. ..................... 438/613; 438/118; 438/119; 438/121; 257/676; 257/778; 257/782; 257/783; 257/E21.503; 257/E21.508; 257/E23.021; 257/E23.031; 257/E23.046; 257/E23.126
(58) Field of Classification Search ............... 438/118, 438/119, 121, 613; 257/676, 782, 783, E21.503, 257/E21.508, 778, E23.021, E23.031, E23.046, 257/E23.126
See application file for complete search history.

(56) References Cited

U.S. PATENT DOCUMENTS

| | | | |
|---|---|---|---|
| 6,432,748 | B1 | 8/2002 | Hsu |
| 6,498,392 | B2 | 12/2002 | Azuma |
| 6,855,577 | B2 | 2/2005 | Azuma |
| 2001/0044198 | A1 | 11/2001 | Kawashima |
| 2006/0172565 | A1 | 8/2006 | Bernier et al. |

FOREIGN PATENT DOCUMENTS

| | | |
|---|---|---|
| JP | A 02-240940 | 9/1990 |
| JP | A 04-306867 | 10/1992 |
| JP | A 07-074287 | 3/1995 |
| JP | A-2001-210743 | 8/2001 |
| JP | A 2004-281486 | 10/2004 |

*Primary Examiner*—Long K Tran
(74) *Attorney, Agent, or Firm*—Oliff & Berridge, PLC

(57) ABSTRACT

A semiconductor device manufacturing method includes (a) bonding a first surface of a metal plate to a substrate, (b) forming a plurality of metal posts that are arranged in vertical and lateral directions in a plan view and include a first metal post and a second metal post, by partially etching the metal plate bonded to the substrate from a second surface of the metal plate, (c) fixing an integrated circuit (IC) element to the second surface of the first metal post, (d) coupling the second metal post and a pad terminal of the integrated circuit element via a conductive material, (e) resin-sealing the integrated circuit element, the metal posts, and the conductive material by providing a resin onto the substrate, and (f) removing the substrate from the resin and the first surfaces of the metal posts sealed using the resin.

5 Claims, 22 Drawing Sheets

SEMICONDUCTOR DEVICE MANUFACTURING METHOD, SEMICONDUCTOR DEVICE, AND WIRING BOARD

The entire disclosure of Japanese Patent Application No. 2007-012741, filed Jan. 23, 2007 is expressly incorporated by reference herein.

BACKGROUND

1. Technical Field

The present invention relates to a semiconductor device manufacturing method, a semiconductor device, and a wiring board.

2. Related Art

Semiconductor packages are broadly categorized into peripheral type packages whose outside terminals are disposed in the periphery of a package and area type packages whose outside terminals are disposed below the undersurface of a package. Peripheral type packages are represented by a dual inline package (DIP), a small outline package (SOP), and a quad flat package (QFP) as shown in FIGS. 21A to 21C. For example, in FIG. 21D, a peripheral type package is manufactured by mounting an integrate circuit (IC) element 210 on a die pad 201 serving as a chip mounting part, then coupling an electrode of the IC element 210 and leads 203 of the a lead frame via gold wires or the like, and resin-sealing all these components except for portions of the outer peripheries of the leads 203. Portions of the leads 203 inside the resin package are called "inside terminals" and portions of the leads 203 outside the resin package are called "outside terminals."

Area type packages are represented by ball grid array (BGA) packages as shown in FIGS. 22A, 22B, 23A, and 23B. For example, in these drawings, an area type package is manufactured by mounting the IC element 210 on the substrate 211, electrically coupling the substrate 211 and the IC element 210 via a gold wire, solder, or a gold bump, and resin-sealing the IC element 210 and the like. A BGA package in which the substrate 211 and the IC element 210 are coupled via a gold wire 213, as shown in FIGS. 22A and 22B, is also called a "gold wire BGA package." A BGA package in which the substrate 211 and the IC element 210 are coupled via a bump 223, as shown in FIGS. 23A and 23B, is also called a "bump BGA package." Among bump BGA packages is a type of bump BGA package that is not resin-sealed. The outside terminals of an area type package are not leads and, for example in FIGS. 23A to 23B, are electrodes (or solder balls) 225 mounted on the back of the substrate 211.

In recent years, a package is also manufactured, for example in FIG. 24A to 24I, by forming cylindrical terminals 233 and a die pad 235 on a metal plate 231 by electrical plating, then mounting the IC element 210 on the die pad 235, coupling the IC element 210 and the terminals 233 via the gold wires 213, then resin-sealing these components, removing the metal plate 231 from a resin molding 236, and cutting the resin molding 236 into individual products.

More specifically, in FIGS. 24A and 24B, first, a resist is applied onto the metal plate 231, and subjected to exposure and development so as to form a resist pattern 237. Next, as shown in FIG. 24C, for example, copper is formed on the surface of the metal plate 231 exposed from below the resist pattern 237 by electrical plating so as to form the cylindrical terminals 233 and the die pad 235. Then, as shown in FIG. 24D, the resist pattern is eliminated. Next, as shown in FIG. 24E, the IC element 210 is mounted on the die pad 235 formed by electrical plating, and wire-bonded to the terminals 233.

Then, as shown in FIG. 24F, the IC element 210, the gold wires 213, and the like are resin-sealed. Next, as shown in FIG. 24G, the metal plate 231 is removed from the resin molding 236. Then, as shown in FIGS. 24H and 24I, margins are cut away from the resin molding 236 so as to complete the package.

Disclosed in JP-A-02-240940 is a technology that completes a peripheral type package by half-etching one surface of a supporter of a flat lead frame, then mounting an IC element on a die pad of the lead frame, subsequently wire-bonding and resin-sealing these components, and then grinding the other surface of the supporter to eliminate the supporter. Disclosed in JP-A-2004-281486 is a technology that attempts to enhance the general versatility of an area type package by disposing wiring from the center of a substrate outward in all directions in a plan view.

The related art examples, that is, peripheral type packages, area type packages, the package shown in FIGS. 24A to 24I, and the package described in JP-A-02-240940 all require a substrate serving as a mounting surface for an IC element, such as a die pad or an interposer, as well as requires a dedicated lead frame or substrate, or a dedicated photomask (to form a cylindrical terminal) according to the size of the IC element or the number of external outputs from the IC element (that is, the number of leads or balls). In particular, if small batches of a variety of products are manufactured, various lead frames or substrates, or various photomasks must be possessed. This prevents a reduction in manufacturing cost.

Also, in JP-A-02-240940, area type packages corresponding to various chip sizes are achieved by disposing wiring from the center of a substrate outward in all directions. However, this technology requires that the pad terminal of the IC element be disposed so as to always overlap the wiring extending from the center of the substrate outward in all directions in a plan view; therefore, flexibility in design is reduced with respect to the layout of the pad terminal. That is, the general versatility of the package is enhanced, while more limitations are imposed on the IC element.

SUMMARY

An advantage of the invention is to provide a semiconductor device manufacturing method, a semiconductor device, and a wiring board that each allow commonality of the specifications of a wiring board for mounting an IC element, without imposing more limitations on the IC element.

According to a first aspect of the invention, a semiconductor device manufacturing method includes (a) bonding a first surface of a metal plate to a substrate, (b) forming a plurality of metal posts that are arranged in vertical and lateral directions in a plan view and include a first metal post and a second metal post, by partially etching the metal plate bonded to the substrate from a second surface of the metal plate, (c) fixing an integrated circuit element to the second surface of the first metal post, (d) coupling the second metal post and a pad terminal of the integrated circuit element via a conductive material, (e) resin-sealing the integrated circuit element, the metal posts, and the conductive material by providing a resin onto the substrate, and (f) removing the substrate from the resin and the first surfaces of the metal posts sealed using the resin.

Here, the "metal plate" refers to, e.g., a copper plate, the "substrate" refers to, e.g., a glass substrate, the "conductive material" refers to, e.g., a gold wire, and the "resin" refers to, e.g., a thermosetting epoxy resin.

According to the semiconductor device manufacturing method according to the first aspect of the invention, the multiple metal posts are used as die pads for mounting an integrated circuit element or as outside terminals of the integrated circuit element. Specifically, the multiple metal posts are selectively used as die pads or outside terminals according to the shape and size of an IC-fixing region that are arbitrarily set. In other words, the metal posts can become any of die pads and outside terminals. The first metal post is used as a die pad, and the second metal post is used as an outside terminal.

Therefore, there is no need for preparing dedicated die pads or a lead frame, or a dedicated substrate (interposer, etc.) for each integrated circuit element type in order to assemble a semiconductor device. This allows commonality of the specifications of a wiring board used to mount an element and used as an outside terminal without limiting the layout (disposition) of the pad terminals with respect to various types of integrated circuit elements. This helps reduce the manufacturing cost of the semiconductor device.

The semiconductor device manufacturing method according to the first aspect of the invention preferably further includes (g) forming the metal posts partway by partially half-etching the metal plate from the first surface prior to the bonding of the first surface of the metal plate. In the forming of the plurality of the metal posts, the metal plate is preferably penetrated by etching the half-etched metal plate from the second surface.

According to this method, the metal posts are easily processed into an arbitrary shape. For example, as shown in FIG. 8A, the metal posts can be shaped to be thick in their upper and lower ports and thin in their central part in a sectional view. Also, as shown in FIGS. 8B and 8C, the metal posts can be each shaped into a trapezoid or an inverted trapezoid in a sectional view.

The semiconductor device manufacturing method according to the first aspect of the invention preferably further includes (h) forming a plated layer for solder joint on the first surface of the metal plate on which the metal posts are formed partway, prior to the bonding of the first surface of the metal plate. Here, the "plated layer for solder joint" refers to, e.g., a silver (Ag) thin film or a palladium (Pd) thin film.

According to this method, the plated layer is formed on the outer peripheries of the metal posts adjacent to the first surfaces thereof. Therefore, if the first surfaces of the metal posts are soldered to, for example, a motherboard or the like, solder can extensively be placed on from the first surfaces of the posts to the outer peripheries of the metal posts adjacent to the first surfaces thereof. This allows the metal posts and the motherboard to be bonded together with high bonding strength.

In the semiconductor device manufacturing method according to the first aspect of the invention, in the fixing of the integrated circuit, the integrated circuit element is preferably mounted in a plurality of units side by side in a plan view on the second surface of the first metal post. In the coupling the second metal post and a pad terminal of the integrated circuit element, the pad terminals of the integrated circuit elements and the second metal post are preferably coupled via the conductive material. In the resin-sealing of the integrated circuit element, the integrated circuit elements, the metal posts, and the conductive material are preferably collectively sealed using the resin. The semiconductor device manufacturing method preferably further includes (i) dicing the resin so that the integrated circuit elements are contained in a resin package, after the resin-sealing of the integrated circuit element.

According to this method, a so-called "multi-chip module" (MCM) in which multiple integrated circuit elements are contained in the state of bare chips in a package is provided.

In the semiconductor device manufacturing method according to the first aspect of the invention, the second metal post preferably includes a third metal post and a fourth metal post. The conductive material preferably includes a first conductive material and a second conductive material. In the coupling the second metal post and a pad terminal of the integrated circuit element, the pad terminal of the integrated circuit element and the third metal post are preferably coupled via the first conductive material and the third metal post and the fourth metal post are preferably coupled via the second conductive material.

According to this method, the positions of the outside terminals of the semiconductor device are substantially changed without changing the layout of the metal posts. As a result, the general versatility of the wiring board is further enhanced.

In the semiconductor device manufacturing method according to the first aspect of the invention, in the forming of the plurality of the metal posts, the metal posts are preferably all formed to have identical shapes and identical sizes.

According to a second aspect of the invention, a semiconductor device includes: a plurality of metal posts each having a first surface and a second surface facing a side opposite to the first surface; the metal posts arranged in vertical and lateral directions in a plan view, the metal posts including a first metal post and a second metal post; an integrated circuit element fixed to the first surface of the first metal post; a conductive material, the conductive material coupling the first surface of the second metal post and a pad terminal of the integrated circuit element; and a resin sealing the metal posts, the integrated circuit element, and the conductive material. The second surfaces of the metal posts are exposed from the resin.

In the semiconductor device according to the second aspect of the invention, the first and second posts are preferably all formed to have identical shapes and identical sizes.

In the semiconductor device according to the second aspect of the invention, a plated layer for solder joint is preferably formed on the second surfaces of the metal posts.

Here, among the reliability tests of a semiconductor device is a test in which it is checked whether no abnormality has occurred in a resin package when the resin package undergoes heating with the package forced to absorb water. One of typical failed modes detected in this test is a rupture of the resin package. This is a phenomenon in which when a resin package undergoes heating, water vapor gradually accumulates in the resin package, thereby increasing the pressure, and in which the resin package ruptures from inside when it can no longer endure the increased pressure. Conceivably, this phenomenon occurs because water absorbed in the resin package flocculates around the interface between the metal component (that is, the die pad or outside terminal) and the resin and thus the vapor pressure is intensively increased around the interface.

According to the semiconductor device according to the second aspect of the invention, the metal components are not concentrated around one location unlike a related art die pad. The metal posts serving as die pads or as outside terminals are disposed in a distributed manner in the resin package; therefore, positions where water flocculates are distributed, whereby concentration of the vapor pressure is reduced. This suppresses a rapture of the resin package in the above-mentioned reliability test, thereby enhancing the reliability of the semiconductor device.

According to a third aspect of the invention, a wiring board includes a substrate and a plurality of metal posts arranged in vertical and lateral directions in a plan view on the substrate. The substrate and the metal posts are bonded together via a type of adhesive that loses adhesion force thereof if the adhesive is subjected to a predetermined process. Here, the "type of adhesive that loses adhesion force thereof if the adhesive is subjected to a predetermined process" refers to, for example, an ultraviolet curing adhesive (UV adhesive) that loses adhesion force thereof if an ultraviolet ray (UV) is applied to the adhesive.

According to the wiring board according to the third aspect of the invention, the semiconductor device according to the second aspect of the invention is manufactured by fixing an integrated circuit element to the metal posts disposed in an IC-fixing region, coupling the metal posts disposed in a region other than the IC-fixing region and the pad terminal of the integrated circuit element via the conductive material, resin-sealing the integrated circuit element, the multiple metal posts, and the conductive material by providing the resin onto the substrate, and then removing the substrate from the resin and the metal posts. As a result, there is no need for preparing dedicated die pads or a lead frame, or a dedicated substrate (interposer, etc.) for each integrated circuit element type, allowing the commonality of the specifications of a wiring board.

In the wiring board according to the third aspect of the invention, the metal posts are preferably all formed to have identical shapes and identical sizes.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will now be described with reference to the accompanying drawings.

(1) First Embodiment

Figure 1A:
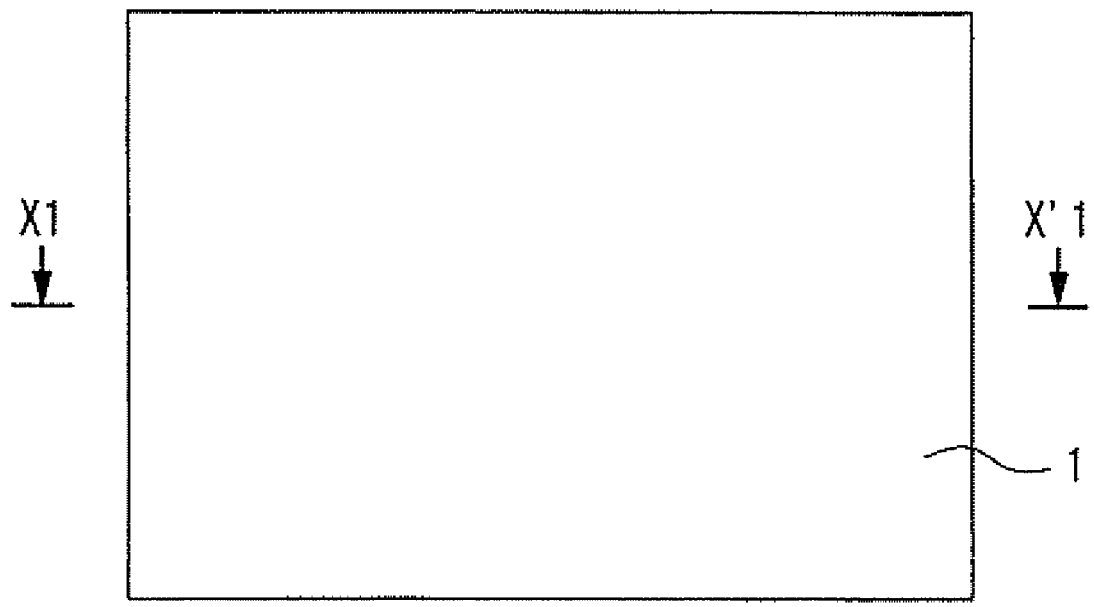
FIGS. 1A and 1B are drawings showing a method for manufacturing a wiring board 50.
Figure 4A:
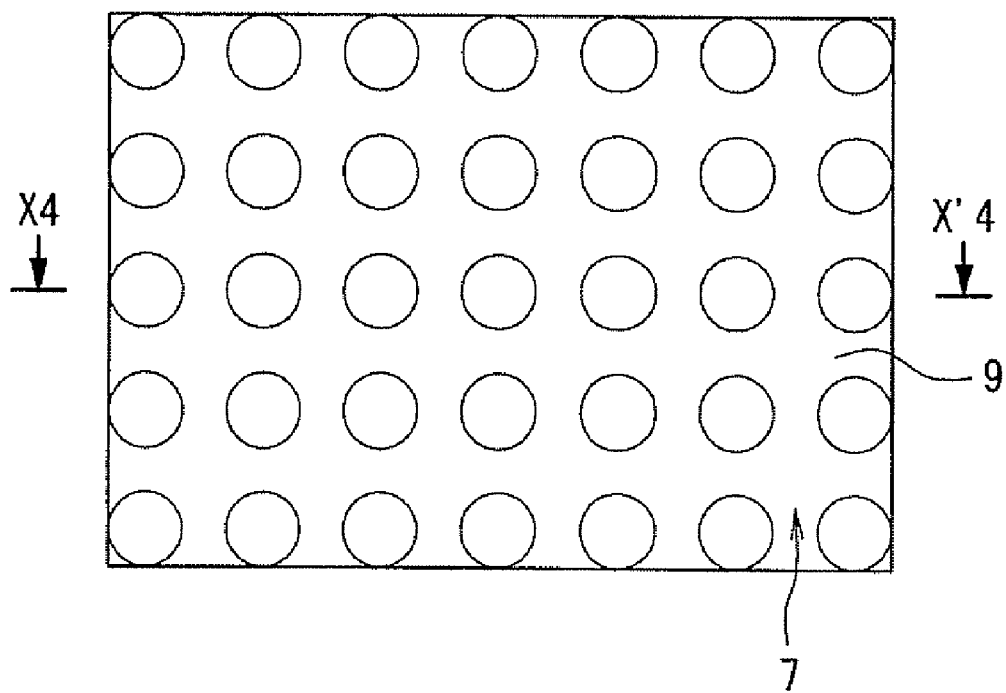
FIGS. 4A and 4B are drawings showing the method for manufacturing the wiring board 50.
Figure 4B:
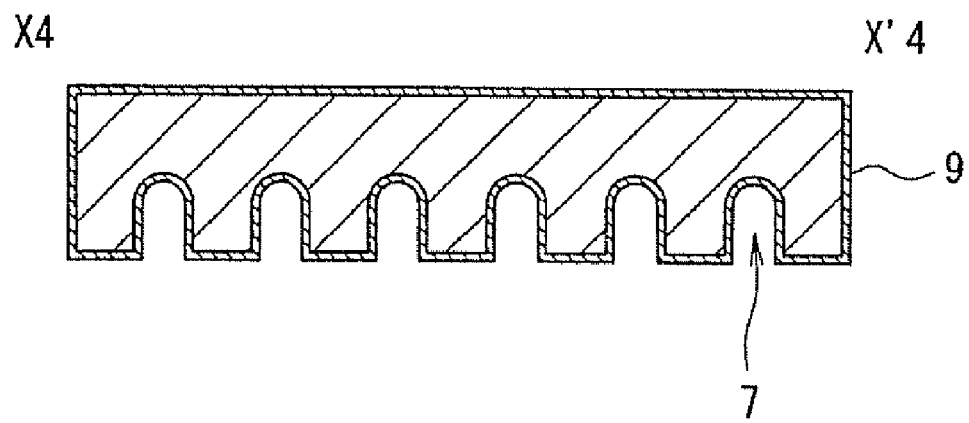
Figure 5A:
FIGS. 5A to 5C are drawings showing the method for manufacturing the wiring board 50.
Figure 5B:
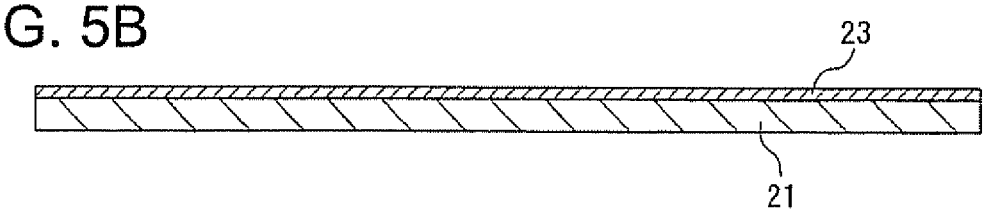
Figure 5C:
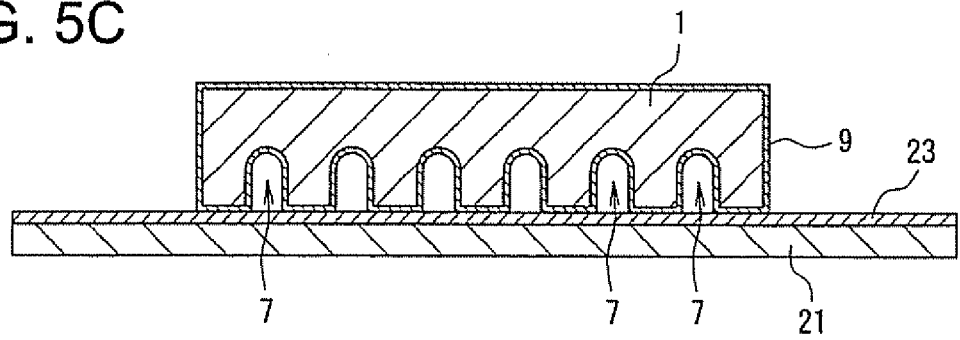
Figure 6A:
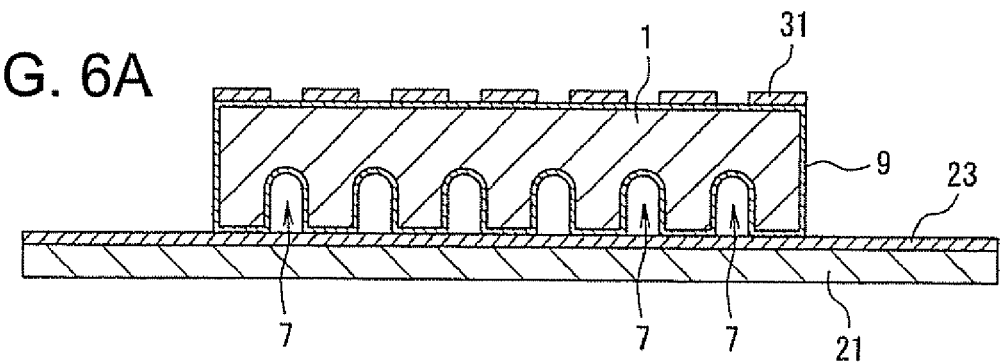
FIGS. 6A to 6C are drawings showing the method for manufacturing the wiring board 50.
Figure 6B:
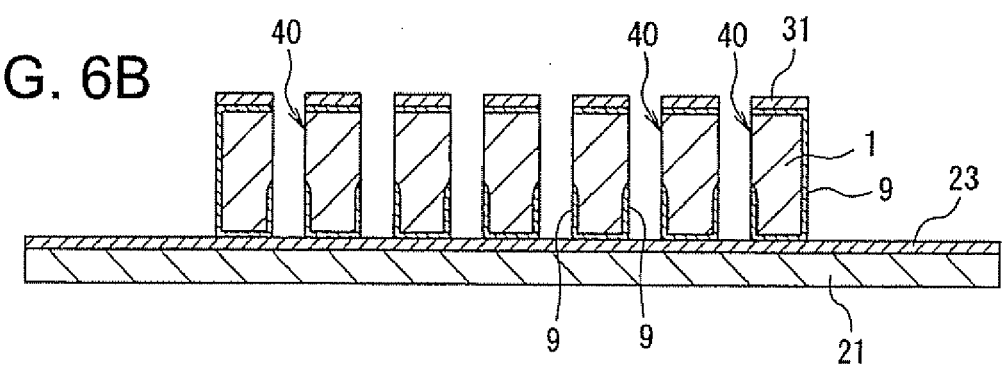
Figure 6C:
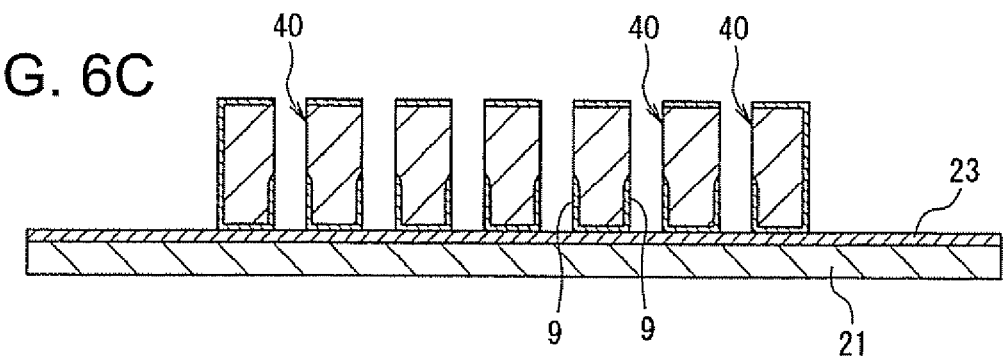

FIGS. 1A to 6C are drawings showing a method for manufacturing a wiring board 50 according to a first embodiment of the invention. More specifically, FIGS. 1A, 2A, and 4A are bottom views, and FIGS. 1B, 2B, and 4B are end views taken along lines X1-X'1, X2-X'2, and X4-X'4 of FIGS. 1A, 2A, and 4A, respectively. FIGS. 6A to 6C are end views showing manufacturing processes following that shown in FIG. 5C.

Figure 1B:
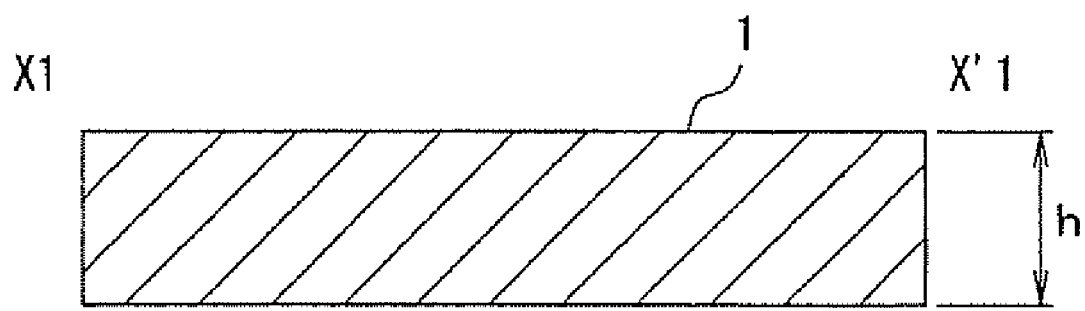
Figure 2A:
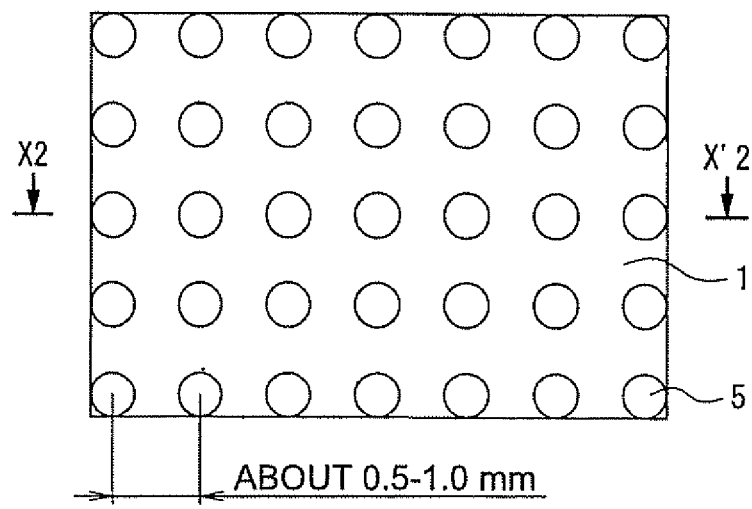
FIGS. 2A and 2B are drawings showing the method for manufacturing the wiring board 50.
Figure 2B:
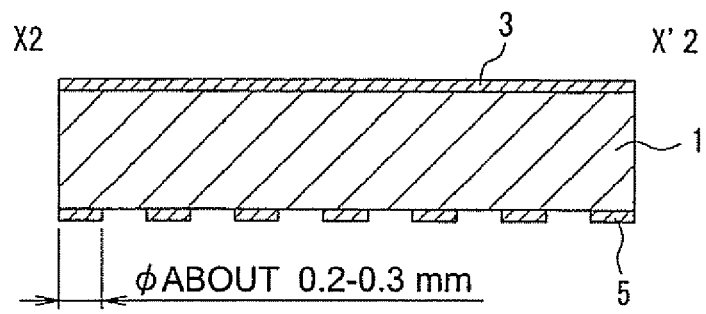

First, a copper plate 1 as shown in FIGS. 1A and 1B is prepared. It is sufficient that the vertical and lateral sizes of the copper plate 1 in a plan view are larger than those of the package shape of a semiconductor device to be made of the copper plate 1. The thickness h of the copper plate 1 is, for example, about 0.10 to 0.30 mm. Next, as shown in FIGS. 2A and 2B, the resist 3 entirely covers the top surface of the copper plate 1, and a resist pattern 5 is formed on the undersurface of the copper plate 1 so that the undersurface is partially exposed. As shown in FIGS. 2A and 2B, for example, the resist patterns 5 each take the shape of a regular circle, and has a center-to-center interval (that is, pitch) of about 0.5 to 1.0 mm and a diameter φ of about 0.2 to 0.3 mm.

Figure 3:
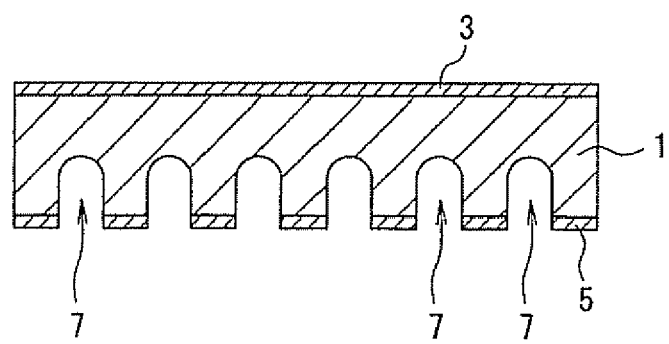
FIG. 3 is a drawing showing the method for manufacturing the wiring board 50.

Next, as shown in FIG. 3, the undersurface of the copper plate 1 is half-etched (that is, the copper plate 1 is etched partway in the thickness direction) with the resist patterns 5 as masks so as to form recesses 7 on the undersurface. For example, a ferric chloride solution is used to etch the copper plate 1. Subsequently, as shown in FIGS. 4A and 4B, the top and under surfaces of the copper plate 1 are plated with a metal thin film 9 made of silver (Ag) or palladium (Pd) or the like. This plating with the metal thin film 9 may be performed before the copper plate 1 is etched.

Before or after or simultaneously with such plating, a substrate 21 as shown in FIG. 5A is prepared and its top surface is coated with an adhesive, as shown in FIG. 5B. The substrate 21 is, for example, a glass substrate. The adhesive 23 is, for example, a solder resist, an ultraviolet curing adhesive (that is, UV adhesive), a thermosetting adhesive, or the like. Then, as shown in FIG. 5C, the undersurface of the plated copper plate 21 is pressed against the top surface of the substrate 21 coated with the adhesive 23 so that these surfaces adhere to each other.

Figure 7:
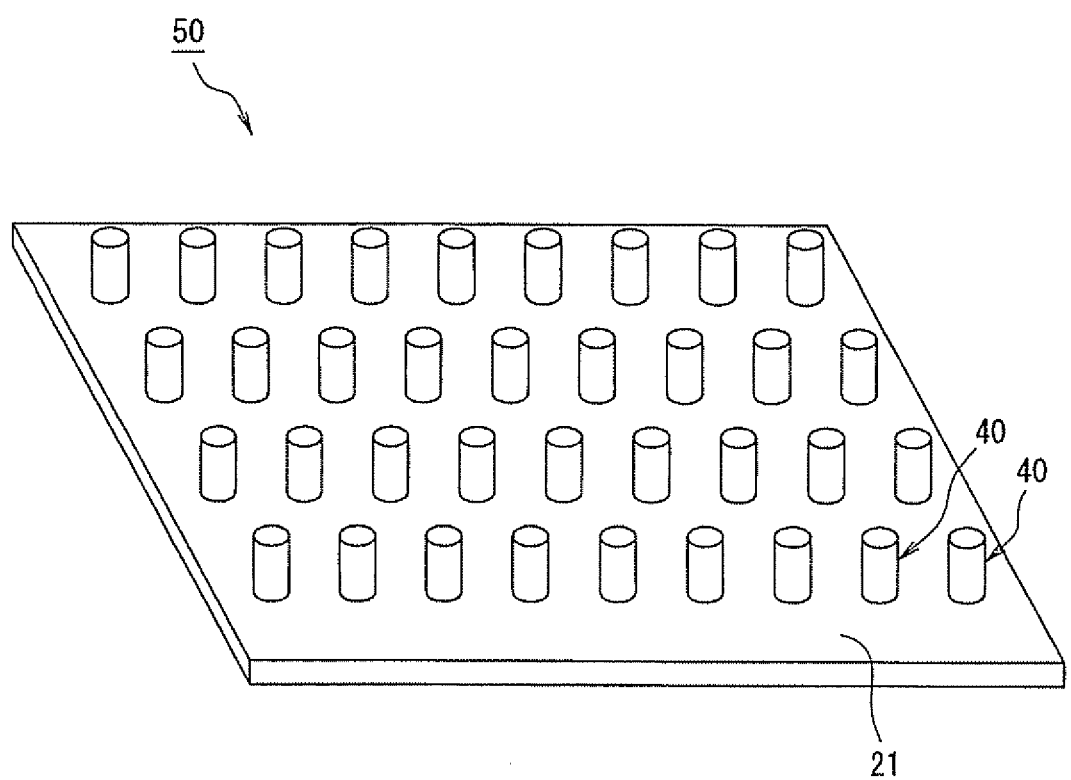
FIG. 7 is a drawing showing a configuration example of the wiring board 50.

Next, as shown in FIG. 6A, resist patterns 31 are formed on the top surface of the copper plate 1 so as to cover the top surface in a manner that apertures are provided in regions on the top surface where the recesses 7 are formed in a plan view. Then, as shown in FIG. 6B, the copper plate 1 is etched with the resist patterns 31 as masks until it is penetrated so that multiple cylindrical electrodes (hereafter referred to as "posts") 40 are formed. After the multiple posts 40 are formed of the copper plate 1, the resist patterns are eliminated from the top surfaces of the posts 40, as shown in FIG. 6C. Thus, the wiring board 50 is completed. As shown in FIG. 7, a great number of posts 40, which are formed of the copper plate 1, are formed on the substrate. These posts have identical shapes and sizes and are disposed at equal intervals in the vertical and lateral directions in a plan view.

Figure 8A:
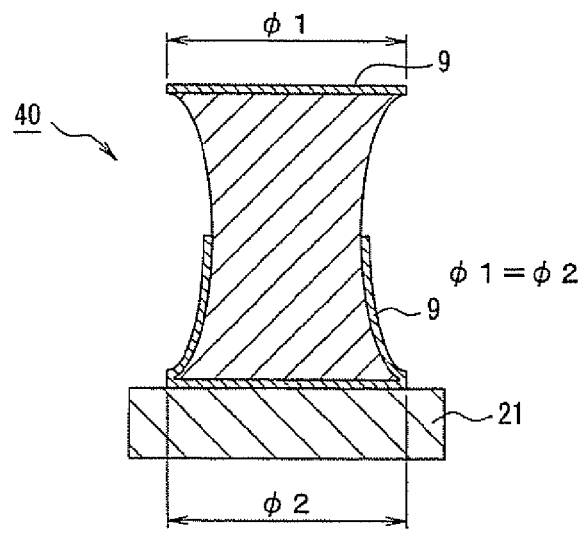
FIGS. 8A to 8C are drawings showing examples of the sectional shape of a post 40.
Figure 8B:
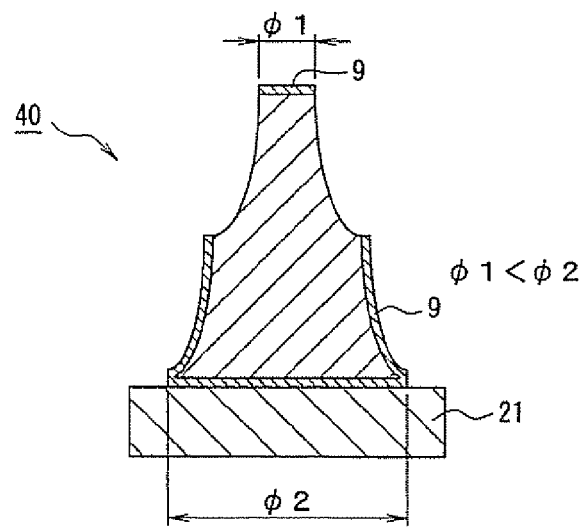
Figure 8C:
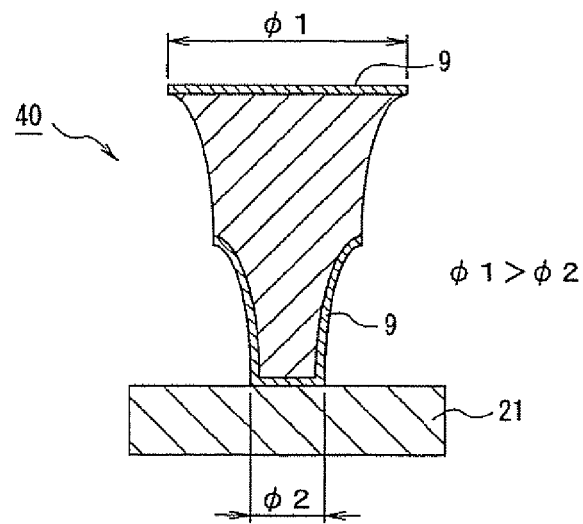

FIGS. 8A to 8C are drawings showing examples of the sectional shape of the posts 40. As shown in FIGS. 8A to 8C, respective diameters $\phi 1$ and $\phi 2$ of the top and under surfaces of the posts 40 formed according to the above-mentioned manufacturing method may have identical sizes, or the $\phi 1$ may be smaller than the $\phi 2$ or the $\phi 1$ may be larger than $\phi 2$. Each case has an advantage.

In order to form each post 40 such that $\phi 1 = \phi 2$ as shown in FIG. 8A, it is sufficient to etch the copper plate 1 from its top and under surfaces using the resist patterns 5 and 31 (see FIGS. 2A and 2B and 6A to 6C) whose masked regions (that is, covered regions) have identical shapes and sizes. In this case, the resist patterns 5 and 31 are formed using an identical type of photomasks; therefore, the manufacturing cost of the wiring board 50 is reduced compared with a case where different types of photomasks are used. If each post 40 is formed such that $\phi 1 < \phi 2$ as shown in FIG. 8B, the area where the substrate 21 and each post 40 adhere to each other is increased, whereby the posture of each post 40 is stabilized. This makes it less likely for the posts 40 to topple over during an IC element mounting process (that is, die attach process) or a resin-sealing process to be discussed later. If each post 40 is formed such that $\phi 1 > \phi 2$ as shown in FIG. 8C, clearances between adjacent posts in the vicinity of the substrate 21 are increased. This makes it relatively easy to fill the clearances with resin.

In order to form each post 40 such that $\phi 1 < \phi 2$ as shown in FIG. 8B, it is sufficient that the masked regions of the resist patterns 5 formed on the undersurface of the copper plate 1 and those of the resist patterns 31 formed on the top surface of the copper plate 1 are made into concentric circles and that the masked regions of the resist patterns 5 are made larger than those of the resist patterns 31. In other words, it is sufficient to make the aperture area of each resist pattern 5 smaller than that of each resist pattern 31. Thus, the top surface of the copper plate 1 is etched more widely than the undersurface thereof so that $\phi 1 < \phi 2$.

In order to form each post 40 such that $\phi 1 > \phi 2$ as shown in FIG. 8C, it is sufficient that the masked regions of the resist patterns 5 formed on the undersurface of the copper plate 1 and those of the resist patterns 31 formed on the top surface of the copper plate 1 are made into concentric circles and that the masked regions of the resist patterns 5 are made smaller than those of the resist patterns 31. Thus, the undersurface of the copper plate 1 is etched more widely than the top surface thereof so that $\phi 1 > \phi 2$.

Further, for example, the outside shape of the copper plate 1 is preferably used as marks so as to register photomasks in the respective processes of forming the resist patterns 5 and 31 on the copper plate 1 by photolithography. This method allows the resist patterns 5 and 31 to be formed on the copper plate 1 with high registration accuracy, thereby sufficiently reducing the amount of misalignment between the resist patterns 5 and 31.

A method for mounting a bare IC element on the wiring board 50 to manufacture the semiconductor device 100 will now be described.

FIGS. 9A to 13B are drawings showing a method for manufacturing the semiconductor device 100 according to the first embodiment. More specifically, FIGS. 9A to 13A are plan views showing a case where the chip size of each IC element 51 is 2 mm per side, and FIGS. 9B to 13B are plan views showing a case where the chip size of each IC element 51 is 1 mm per side. FIGS. 9C to 13C are end views taken along lines Y9-Y'9 to Y13-Y'13 of FIGS. 9B to 13B.

Figure 9A:
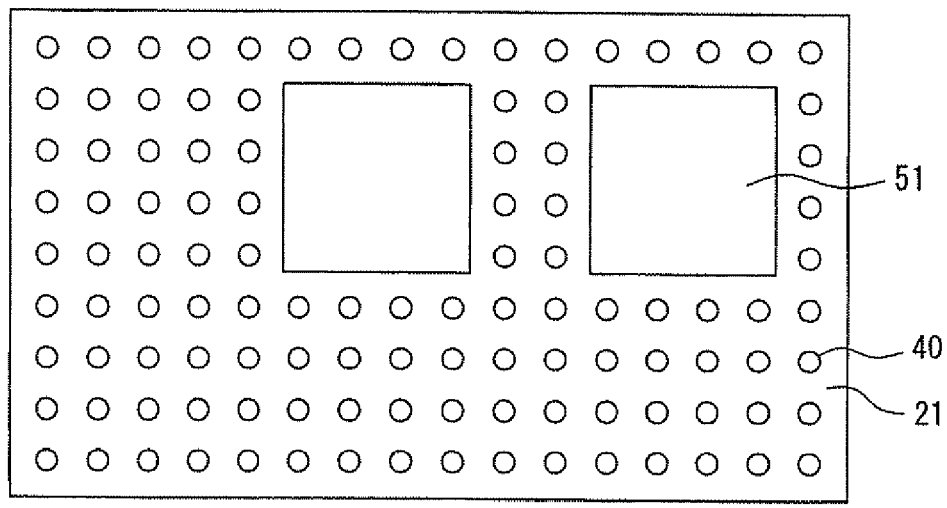
FIGS. 9A to 9C are drawings showing a method for manufacturing a semiconductor device 100.
Figures 9B, 9C:
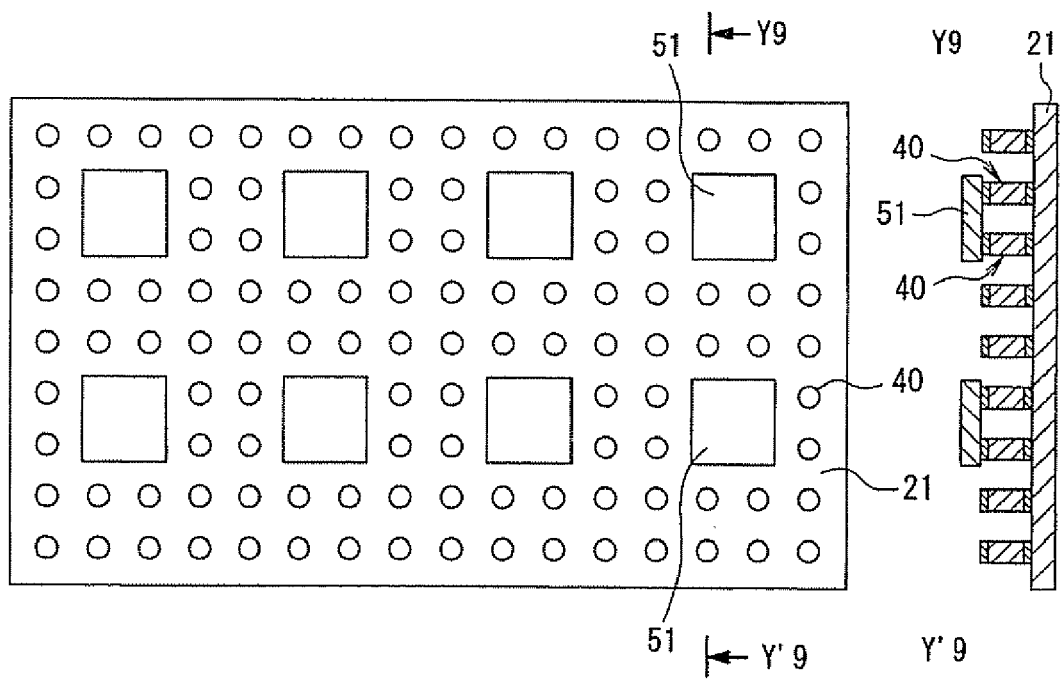
Figure 10A:
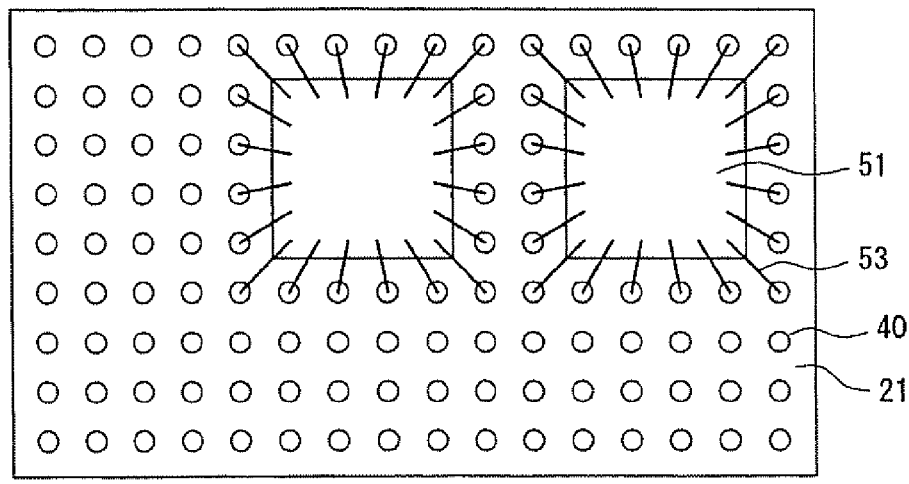
FIGS. 10A to 10C are drawings showing the method for manufacturing the semiconductor device 100.
Figures 10B, 10C:
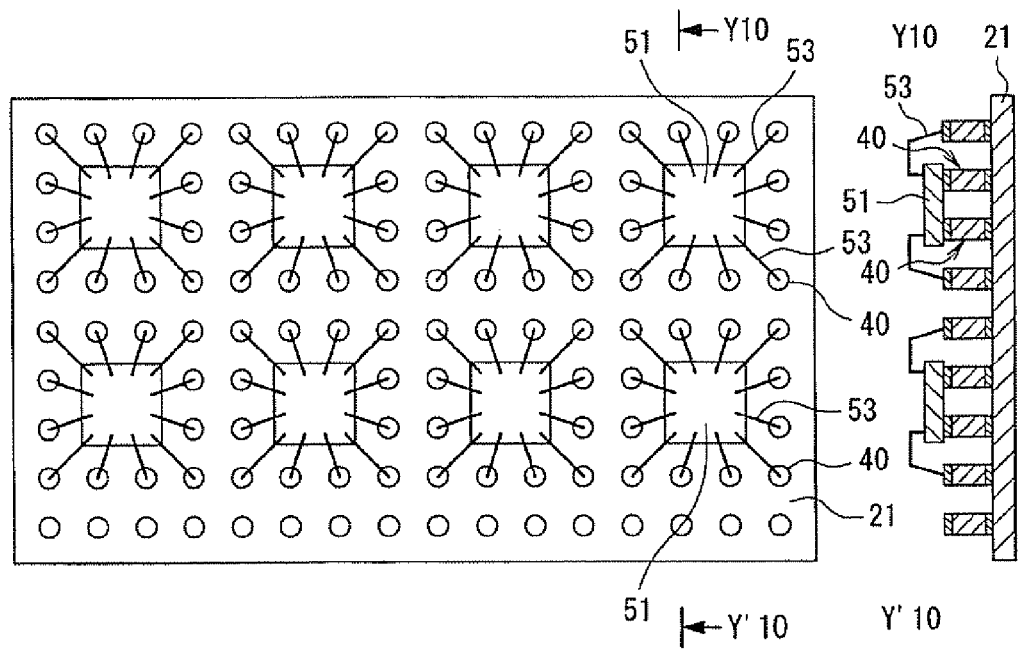
Figure 11A:
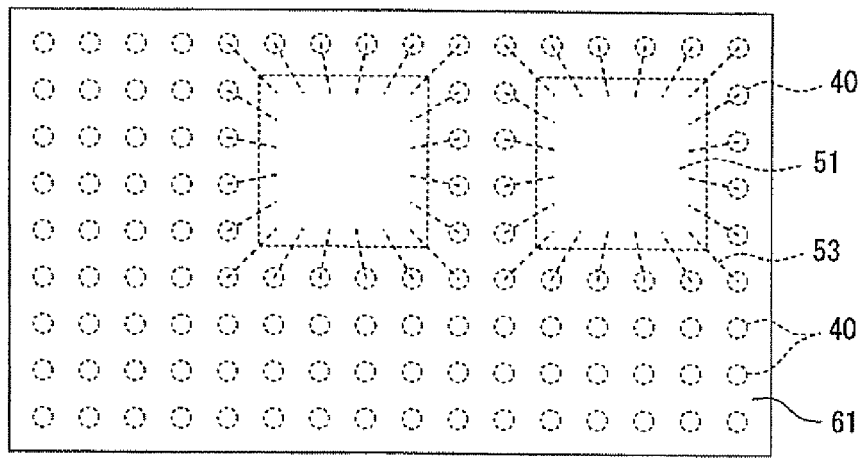
FIGS. 11A to 11C are drawings showing the method for manufacturing the semiconductor device 100.
Figures 11B, 11C:
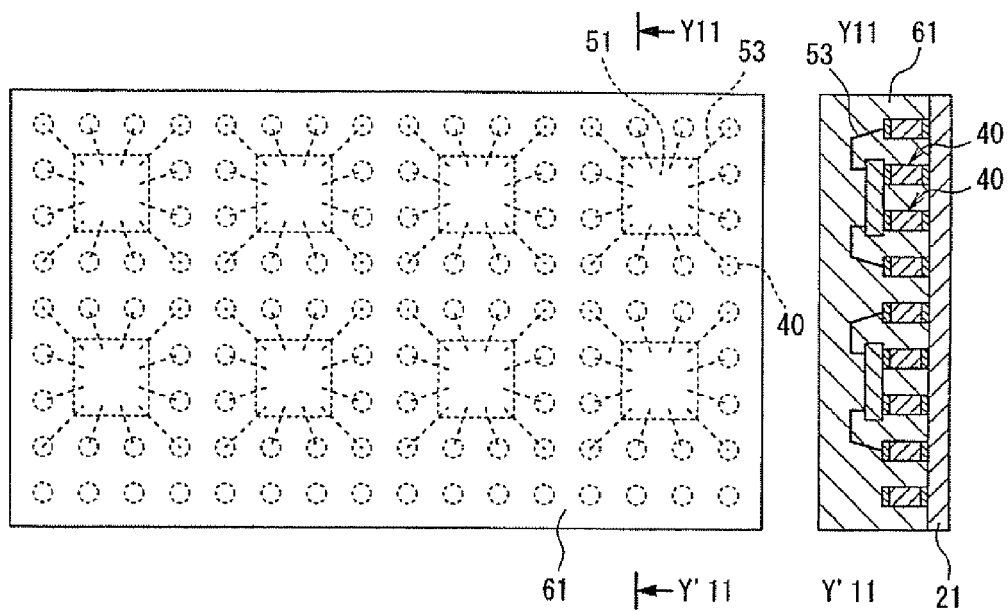

First, as shown in FIGS. 9A to 9C, an adhesive (not shown) is applied to the top surfaces of the posts 40 located in IC-fixing regions, and the back surface of each IC element 51 is brought into contact with the top surfaces of the posts 40 and fixed (die attach process). For example, the adhesive used here is a thermosetting paste or sheet. Next, as shown in FIG. 10A to 10C, the top surfaces of the posts 40 located in regions (that is, regions not located directly below the IC elements 51) other than the IC-fixing regions and the pad terminals of the IC elements 51 are coupled via, for example, the gold wires 53 (wire bonding process). Then, as shown in FIGS. 11A to 11C, the entire region above the substrate 21, including the IC elements 51, the gold wires 53, and the posts 40, is sealed using a resin 61 (resin-sealing process). For example, the resin 61 is a thermosetting epoxy resin, or the like. Since the substrate 21 is made of a material having a relatively small thermal expansion coefficient, such as a glass substrate, as described above, the substrate 21 hardly expands in the vertical and lateral directions in a plan view even if heat of the order of 200° C. is applied thereto during the resin-sealing process. Therefore, the intervals between adjacent posts 40 are maintained constant even during the resin-sealing process.

Figure 12A:
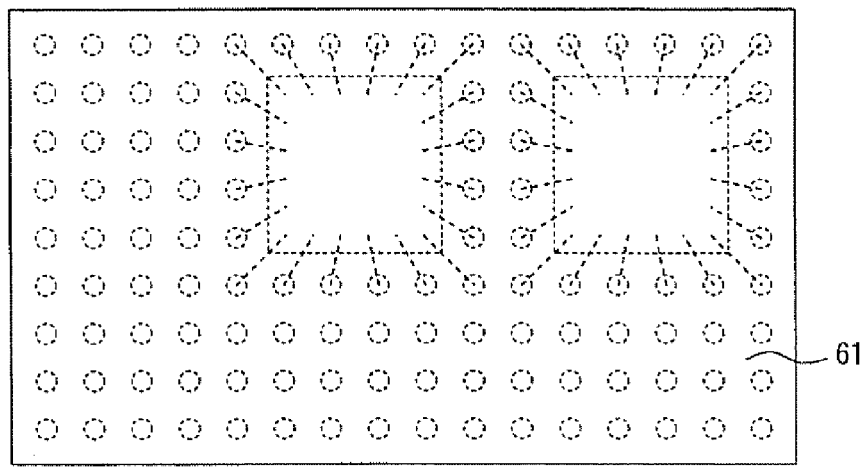
FIGS. 12A to 12C are drawings showing the method for manufacturing the semiconductor device 100.
Figures 12B, 12C:
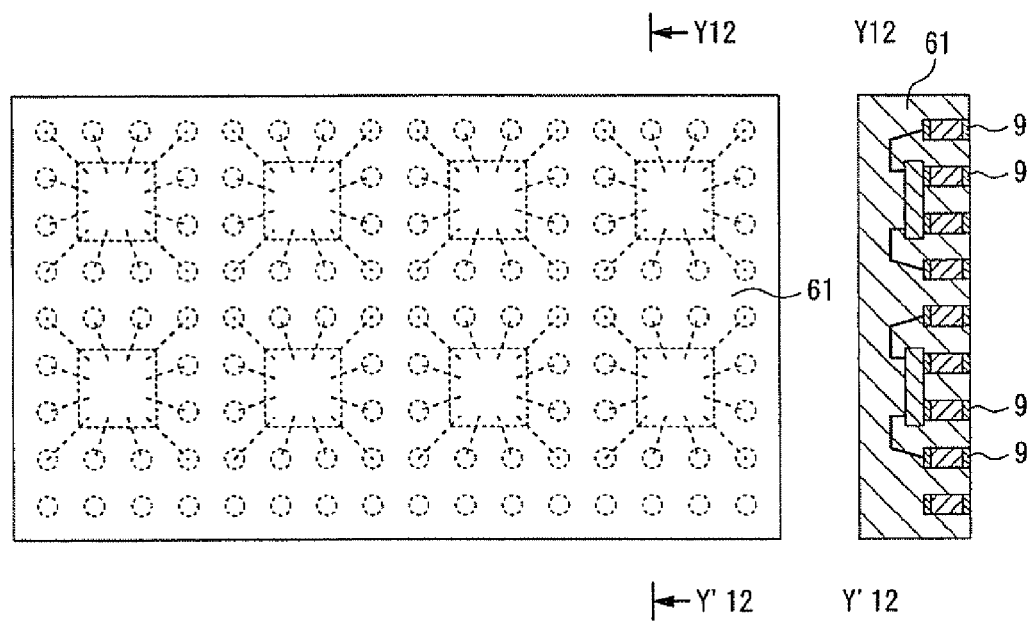
Figure 15A:
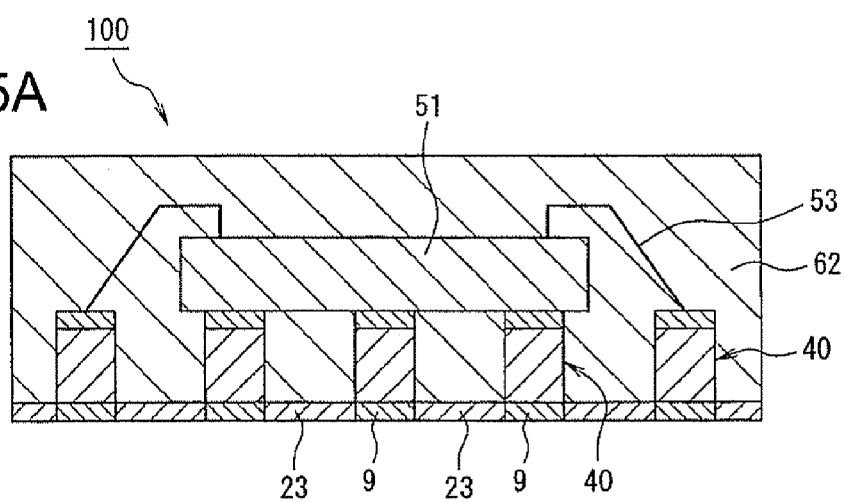
FIGS. 15A and 15B are drawings showing example configurations of the semiconductor device 100.
Figure 15B:
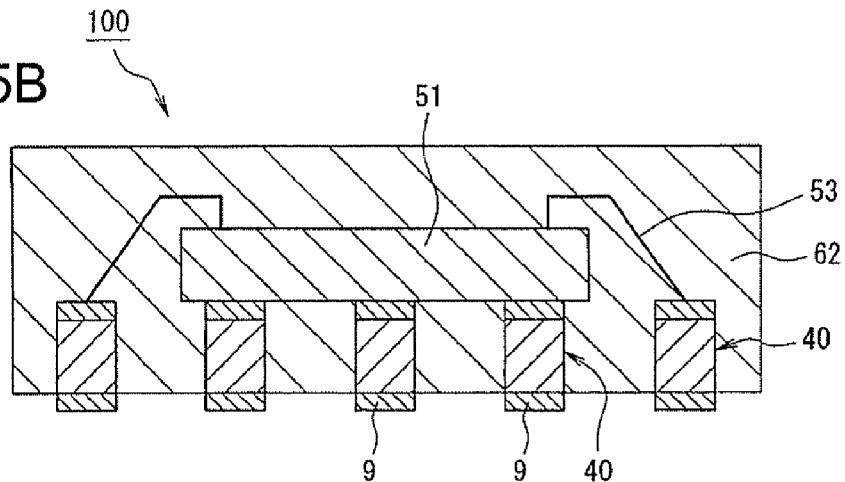

Subsequently, as shown in FIGS. 12A to 12C, a resin 61 containing the IC elements 51 is removed from the substrate. If an ultraviolet curing adhesive has been used as the adhesive 23, the resin 61 may be removed from the substrate after ultraviolet rays are applied to the surfaces where the posts 40 and the substrate adhere to each other so as to reduce the adhesion force of the adhesive. Or the resin 61 may be removed from the substrate by only applying mechanical force to the resin 61. The adhesive may be left on the resin or on the substrate after the removal. FIG. 15A shows a case where the adhesive 23 is left on the resin 61, and FIG. 15B shows a case where the adhesive 23 is removed together with the substrate. This embodiment may be any of what are shown in FIGS. 15A and 15B. After the resin 61 is removed from the substrate, the metal thin film 9 is exposed from the removed surface of the resin 61.

Figure 13A:
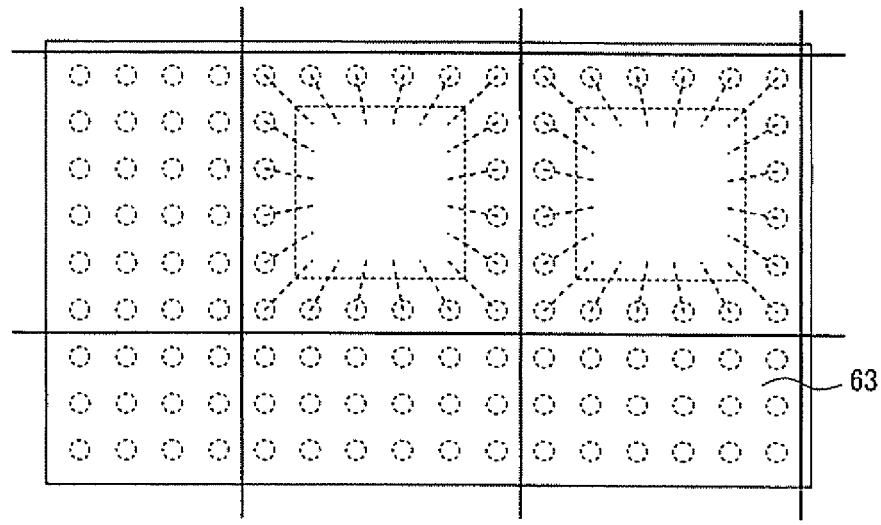
FIGS. 13S to 13C are drawings showing the method for manufacturing the semiconductor device 100.
Figures 13B, 13C:
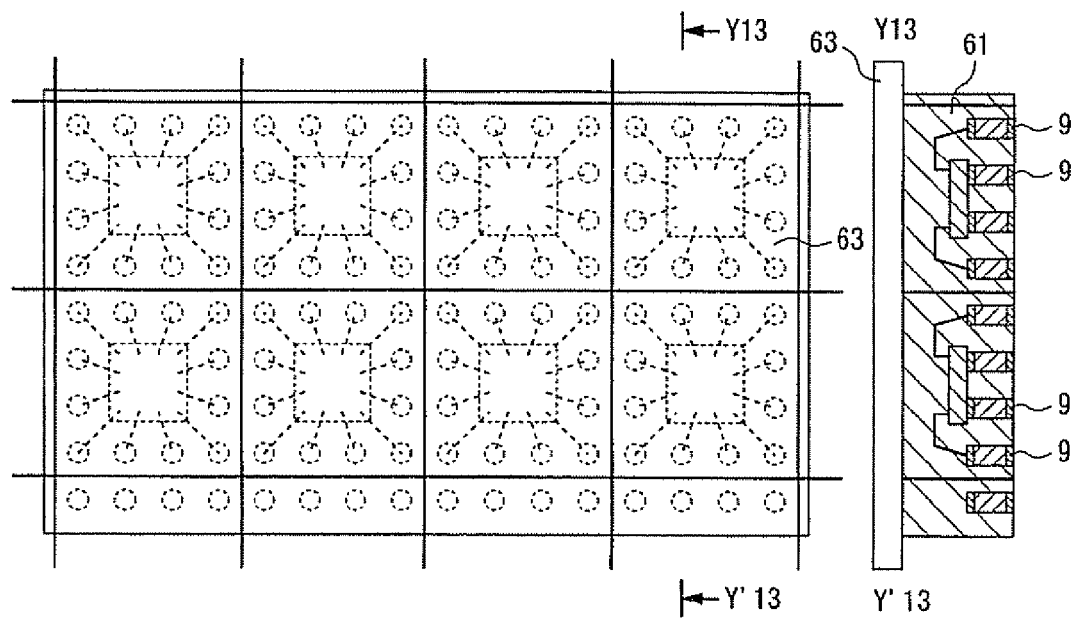

Next, in FIGS. 12A to 12C, product marks (not shown) are put on the top surface of the resin 61 (that is, the surface where no terminal is exposed), for example, using ink and a laser. Then, as shown in FIGS. 13A to 13C, for example, an ultraviolet curing tape (UV tape) 63 is continuously affixed on the entire top surface of the resin 61. Then, the resin 61 is cut along the outside shapes of products using a dicing saw (dicing process). In this dicing process, the resin 61 is divided into individual resin packages 62 and margins of the resin that no longer become a product are cut away. For example, the resin is cut using, as marks, the posts 40 exposed from the undersurface (that is, the surface from which terminals are exposed) of the resin 61.

Figure 14A:
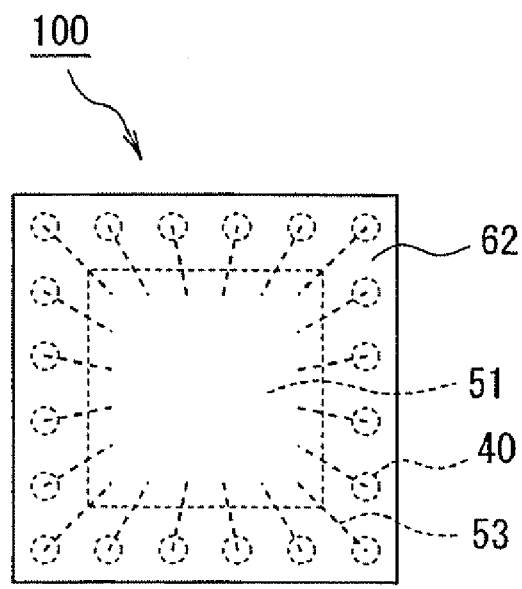
FIGS. 14A to 14C are drawings showing an example configuration of the semiconductor device 100.
Figures 14B, 14C:
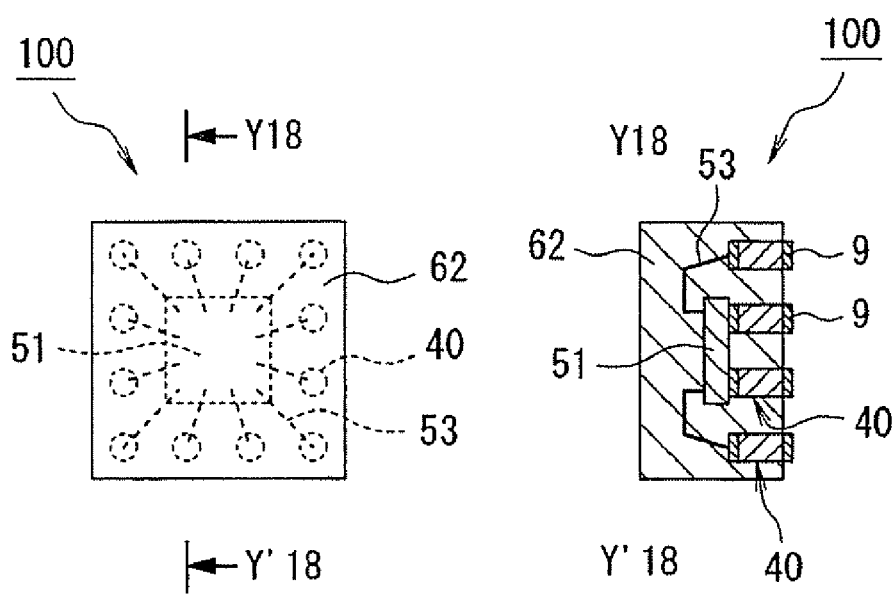

Thus, as shown in FIGS. 14A to 14C, the semiconductor device 100 including the IC element 51, the posts 40, the gold wires 53, and the resin package 62 for packaging these components is completed. The posts 40 (that is, outside terminals)

exposed from the resin package may be left intact, or solder balls or the like may be mounted on the exposed surfaces of the posts 40.

Table 1 shows one example of the applied chip size, the count of (external) terminals below a chip, the maximum count of outside terminals, and the package size of the semiconductor device 100 according to the first embodiment.

TABLE 1

| Pitch (mm) | Size of applied chip (mm SQ) | Terminal count below chip | Max. outside terminal count | Package size (mm) |
|---|---|---|---|---|
| 0.5 | 1 | 4 | 16 | 2.5 |
| 0.5 | 2 | 16 | 36 | 3.5 |
| 0.5 | 3 | 36 | 64 | 4.5 |
| 0.5 | 4 | 64 | 100 | 5.5 |
| 0.5 | 5 | 100 | 144 | 6.5 |
| 0.5 | 6 | 144 | 196 | 7.5 |
| 0.5 | 7 | 196 | 256 | 8.5 |

Figure 16A:
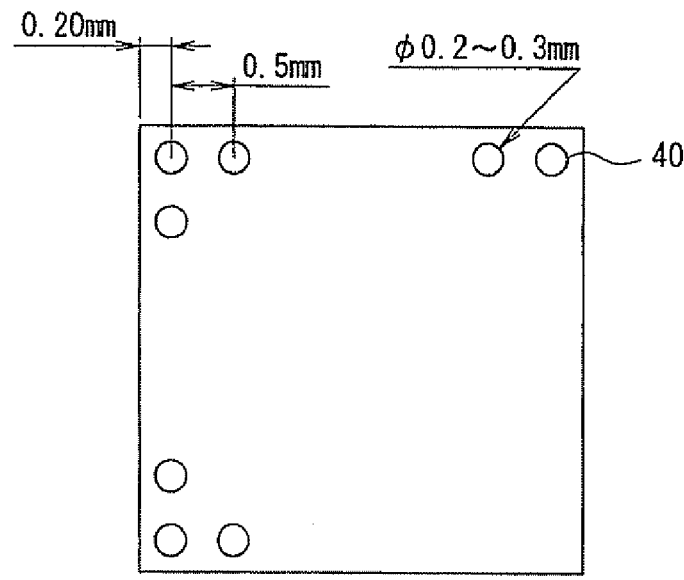
FIGS. 16A and 16B are drawings showing examples in which the posts 40 are disposed in the form of a grid.

In Table 1, the "pitch" refers to the interval between adjacent posts, more specifically, the interval from the center of one post to the center of another post. As shown in Table 1 and FIG. 16A, the pitch is, for example, about 0.5 mm. The "size of applied chip" refers to the chip size of an IC element sealed in a resin package (the shape of an IC element in a plan view is, for example, a square).

The "max. outside terminal count" refers to the maximum count of the posts 40 to be resin-sealed by a resin package. The "package size" refers to the vertical or lateral length of a resin package in a plan view (the shape of a resin package in a plan view is, for example, a square). If the posts 40 are disposed systematically in the vertical and lateral directions in a plan view, more specifically, disposed at the intersections of a grid in a plan view (hereafter simply referred to as "disposed in the form of a grid) as shown in Table 1 and FIG. 16B, a larger area of an IC element-fixing region (that is, "IC-fixing region") or a larger area of a region to be resin-sealed (that is, "region to be sealed") covers a larger number of posts 40.

As described above, according to the semiconductor device 100 according to this embodiment, the posts 40 are used as die pads for mounting the IC elements or as the outside terminals of the IC elements 51. More specifically, the posts 40 are selectively used as die pads or as outside terminals according to the shapes and sizes of IC-fixing regions that are arbitrarily set. In other words, the posts 40 can become any of die pads and outside terminals. Therefore, unlike in related art examples, there is no need for preparing dedicated die pads or a lead frame, or a dedicated substrate (interposer, etc.) for each type of IC element 51 in order to assemble a semiconductor device. This allows commonality of the specifications of the wiring board 50 used to mount an element and used as an outside terminal without limiting the layout of the pad terminals with respect to various types of IC elements 51. This helps reduce the manufacturing cost of the semiconductor device.

Also, according to the above-mentioned manufacturing method, the metal thin film 9 is formed on the outer peripheries of the posts 40 adjacent to undersurfaces thereof, as shown in FIGS. 6A to 6C. Therefore, if the undersurfaces of the posts 40 are soldered to a motherboard or the like, solder can extensively be put on from the undersurfaces to the outer peripheries of the posts. This allows the posts 40 and the motherboard to be bonded together with high bonding strength.

Figure 17A:
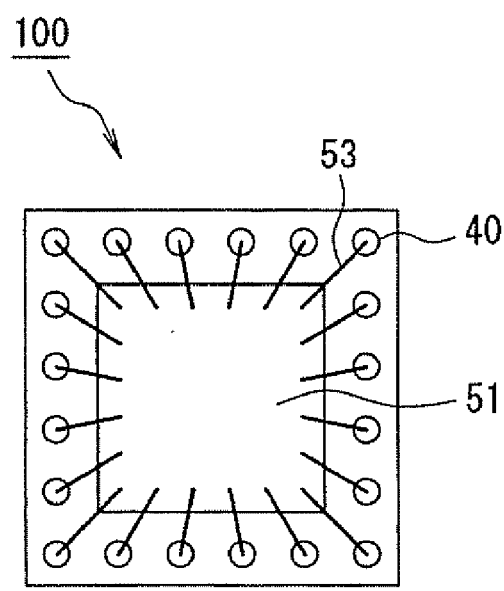
FIGS. 17A to 17C are drawings showing an example configuration of the semiconductor device 100.
Figure 17B:
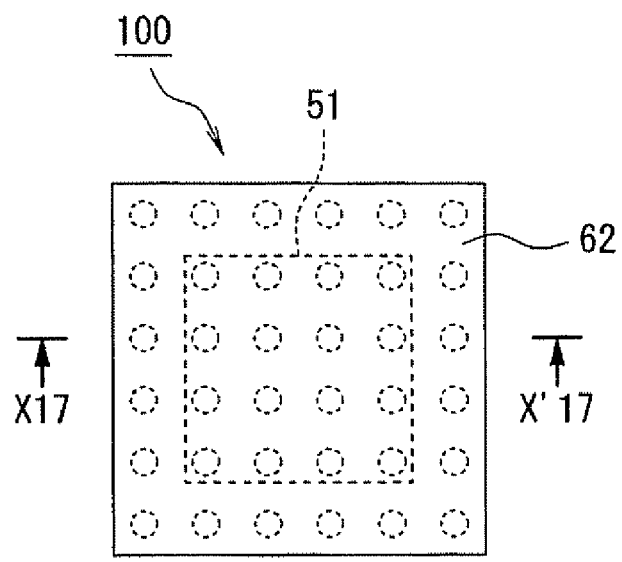
Figure 17C:
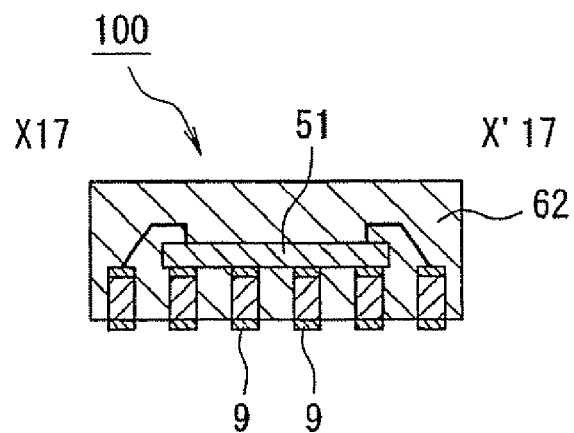

Also, according to the semiconductor device according to this embodiment, as shown in FIGS. 17A to 17C, the metal components are not concentrated around one location unlike a related art die pad. The posts 40 serving as die pads or as outside terminals are disposed in a distributed manner in the resin package 62; therefore, positions where water flocculates are distributed, whereby concentration of vapor pressure is reduced. This suppresses a rapture of the resin package 62 in a test involving moisture absorption and heating, thereby enhancing the reliability of the semiconductor device. FIGS. 17A to 17C show a case where the chip size of each IC element 51 is 2 mm per side, and in FIG. 17A, the resin package is not shown to avoid complication of the drawing.

In the first embodiment, the copper plate 1 corresponds to a "metal plate" in the invention, the posts 40 to "metal posts," the gold wires 53 to a "conductive material," and the metal thin film 9 to a "plated layer."

Figure 16B:
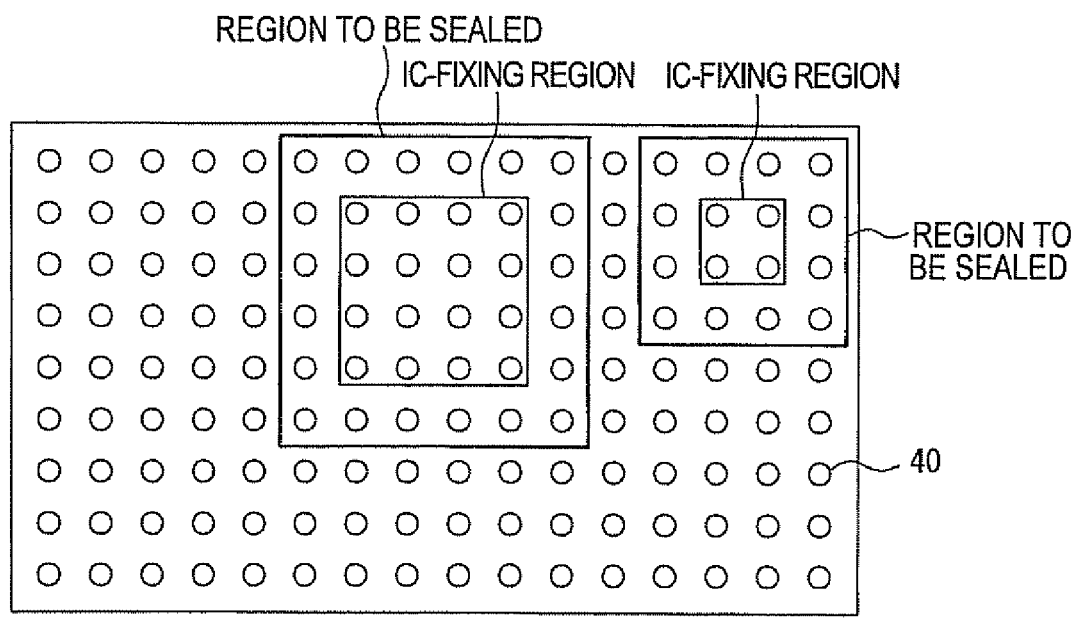
Figure 18:
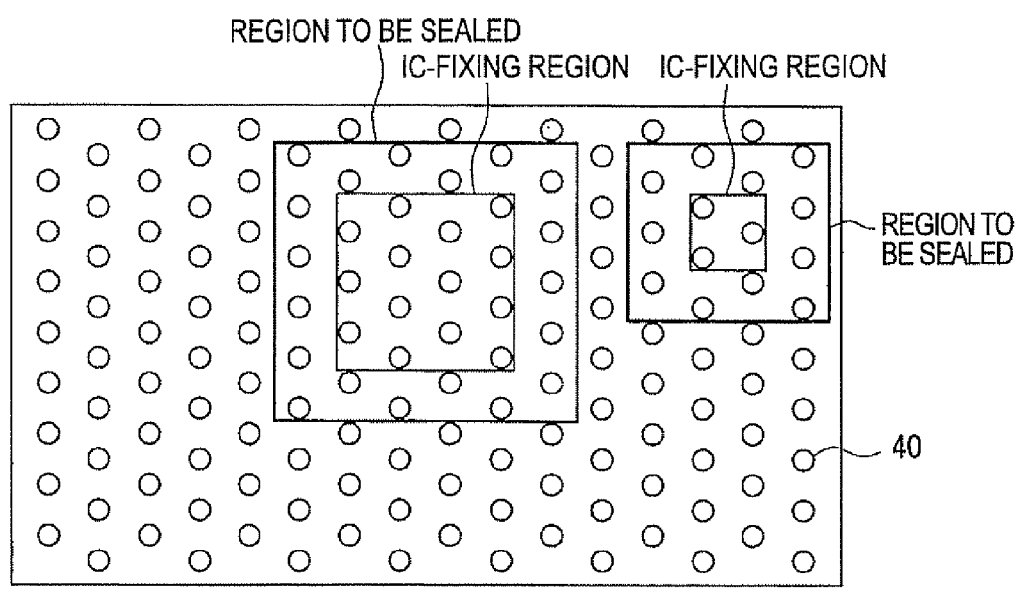
FIG. 18 is a drawing showing an example in which the posts 40 are disposed in a staggered manner.

In the first embodiment, a case where the posts 40 are systematically disposed in the vertical and lateral directions in a plan view, that is, disposed in the form of a grid in a plan view, as shown in FIG. 16B, has been described. However, the disposition of the posts 40 is not limited to such disposition. For example, as shown in FIG. 18, the posts 40 may be disposed in a manner that odd columns and even columns are displaced from each other by half pitch in a plan view, that is, may be disposed in a staggered manner in a plan view. Even with this configuration, the posts 40 can become any of die pads and outside terminals; therefore, no dedicated die pads are needed unlike in related art examples.

Figure 19A:
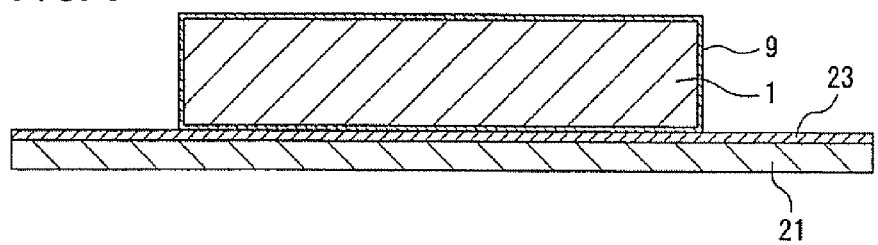
FIGS. 19A to 19C are drawings showing another method for manufacturing the semiconductor device 100.

Also, in the first embodiment, a case has been described where the process of etching the copper plate 1 to form the posts 40 is performed in two stages, in one of which the copper plate 1 is etched from its top surface and in the other of which the copper plate 1 is etched from its undersurface. However, the number of stages of the etching process may be reduced from two from one. Specifically, as shown in FIG. 19A, first, the metal thin film 9 made of Ag or the like is plated on the entire surface of the copper plate 1, whose undersurface has no recesses formed thereon and is flat. Subsequently, the plated undersurface of the copper plate 1 is pressed against the top surface of the substrate 21 that is coated with the adhesive 23 so that these surfaces adhere to each other. Then, as shown in FIG. 6B, the copper plate 1 is etched using resist patterns (not shown) as masks until it is penetrated, so that the multiple posts 40 are formed. After the multiple posts 40 are formed of the copper plate 1, the resist patterns are eliminated, and then, as shown in FIG. 6C, the IC element 51 is mounted on the posts 40 in the IC-fixing region. Then, the pad terminal of the IC element 51 is coupled to the posts 40 in regions other than the IC-fixing region via the gold wires 53.

Figure 19B:
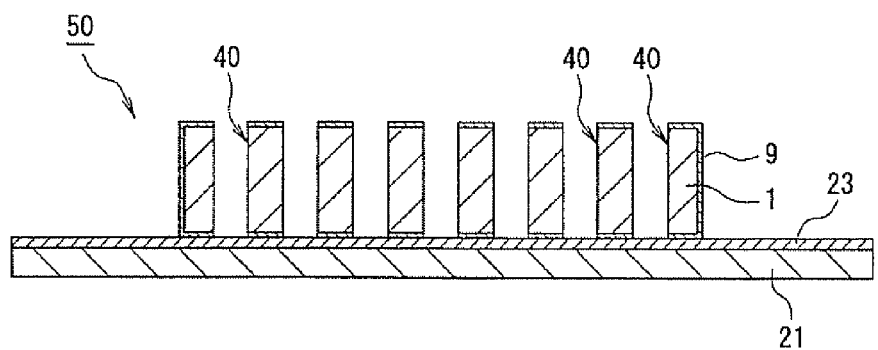
Figure 19C:
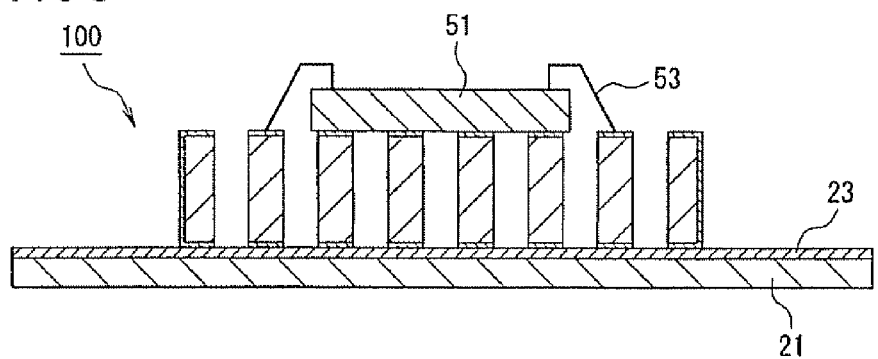

This method allows the number of stages of the etching process to be reduced from two to one, thereby reducing the time required to manufacture the wiring board 50 and thus reducing the manufacturing cost. Note that in the method in FIGS. 19A to 19C, the metal thin film 9 made of Ag or the like is not formed on the outer peripheries of the posts 40. Therefore, the area of each post 40 that is coated with the metal thin film 9 is smaller than that in a case where etching is performed in two stages. Thus, if the undersurfaces of the posts 40 are soldered to, for example, a motherboard or the like, the strength of bonding between the posts 40 and the motherboard is conceivably reduced.

(2) Second Embodiment

In the above first embodiment, a case (that is, a single chip package) where only one chip of IC element 51 is disposed in the resin package 62, as shown in FIGS. 17A to 17C, has been described. However, the invention is not limited to such a configuration.

Figure 20A:
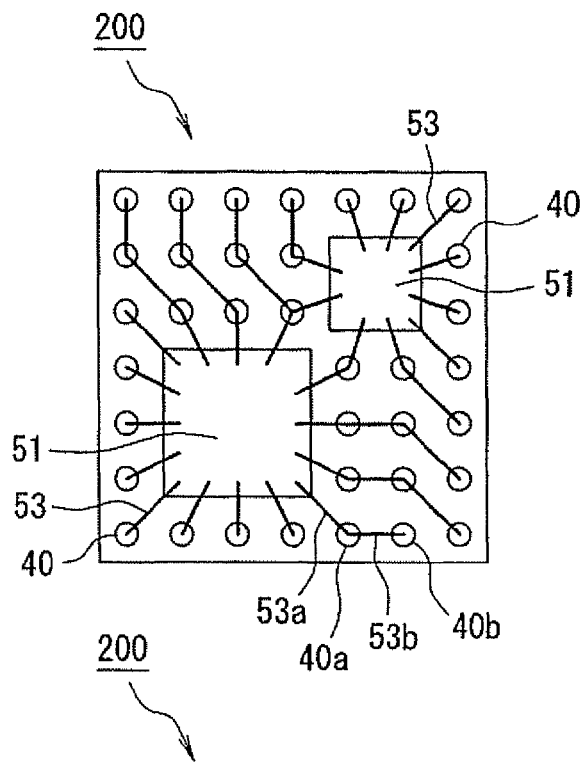
FIGS. 20A to 20C are drawings showing an example configuration of a semiconductor device 200.
Figure 20B:
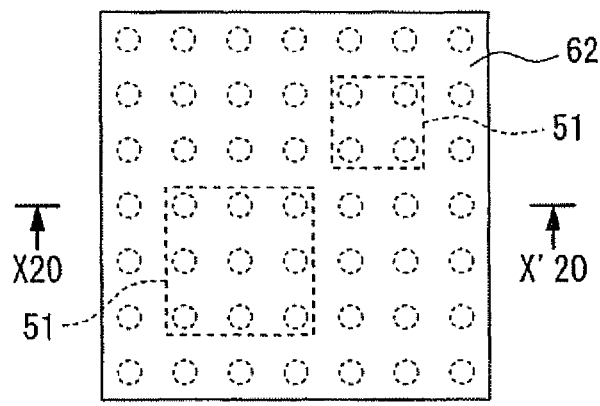
Figure 20C:
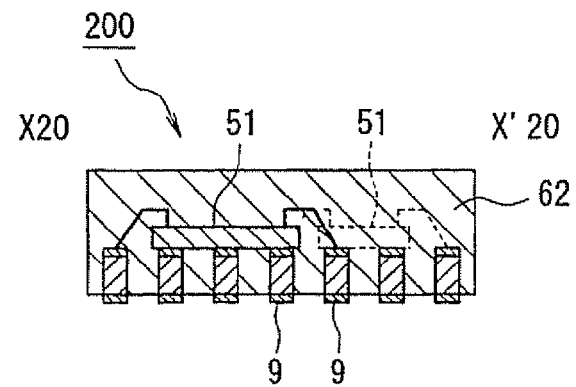
Figure 21A:
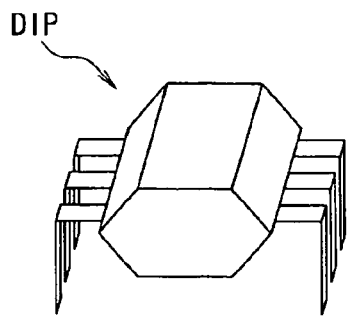
FIGS. 21A to 21D are drawings showing related art examples.
Figure 21B:
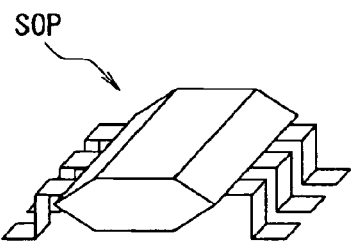
Figure 21C:
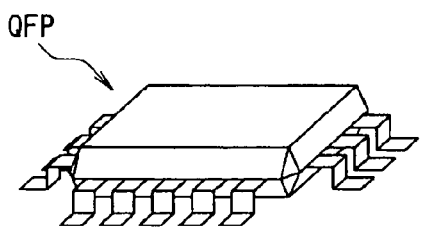
Figure 21D:
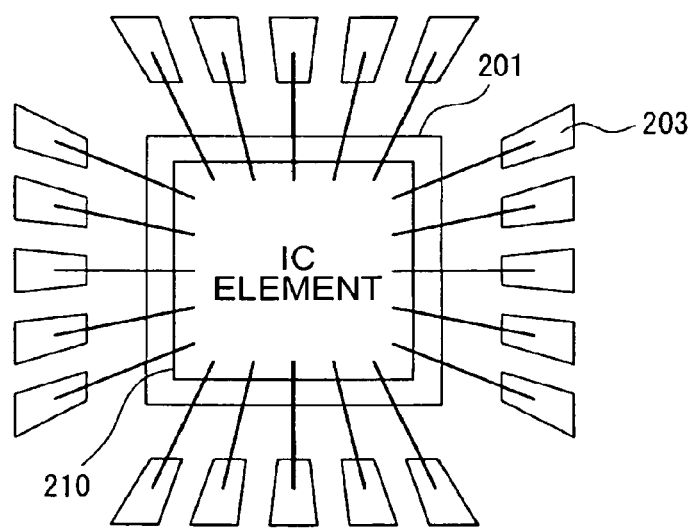
Figure 22A:
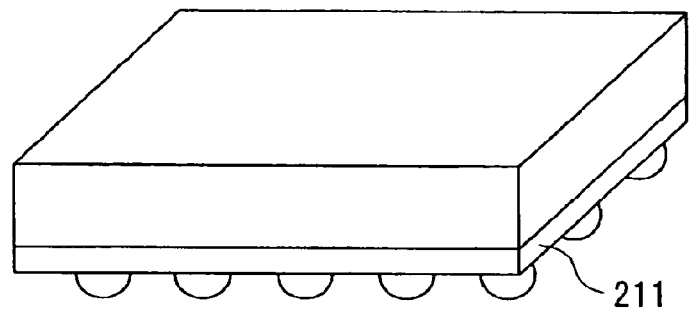
FIGS. 22A and 22B are drawings showing related art examples.
Figure 22B:
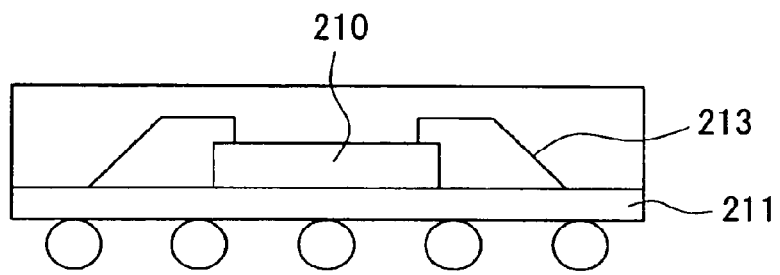
Figure 23A:
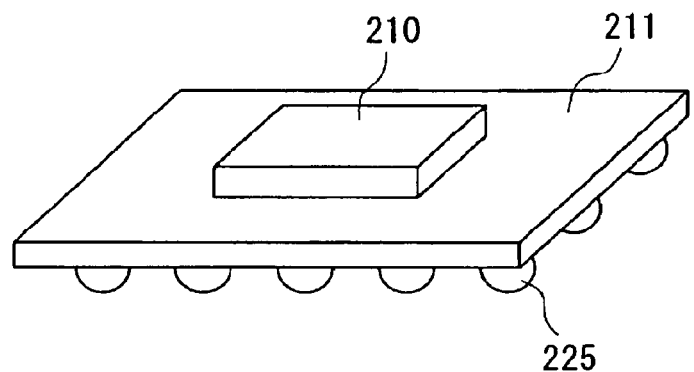
FIGS. 23A and 23B are drawings showing related art examples.
Figure 23B:
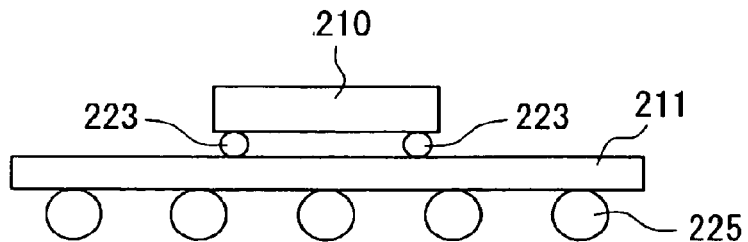
Figure 24A:
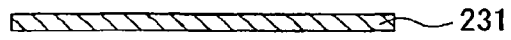
FIGS. 24A to 24I are drawings showing a related art example.
Figure 24B:
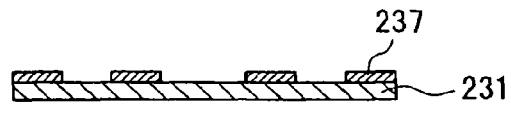
Figure 24C:
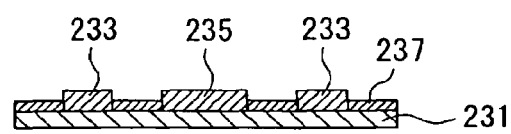
Figure 24D:
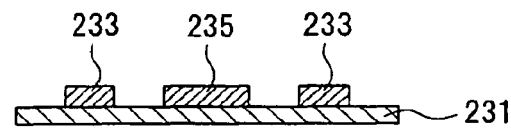
Figure 24E:
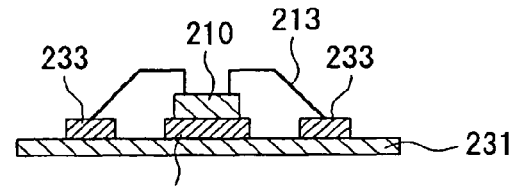
Figure 24F:
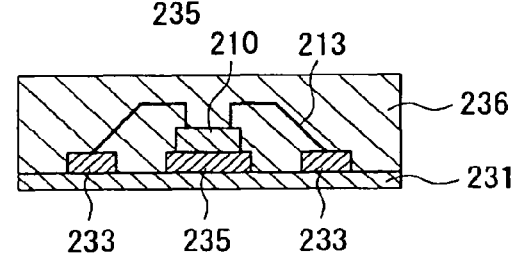
Figure 24G:
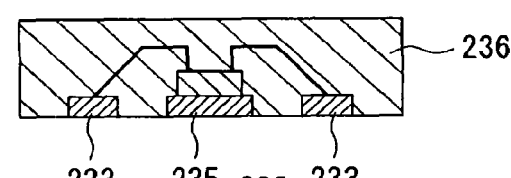
Figure 24H:
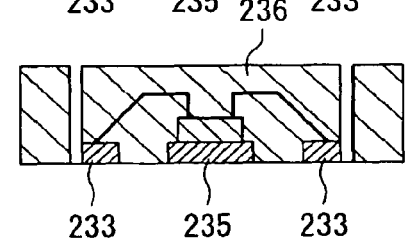
Figure 24I:
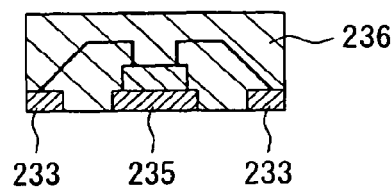

FIGS. 20A to 20C are drawings showing a configuration example of a semiconductor device 200 according to a second embodiment of the invention. More specifically, FIGS. 20A and 20B are plan views showing the configuration example of the semiconductor device 200, and FIG. 20C is an end view taken along line X20-X'20 of FIG. 20B. In FIG. 20A, the resin 61 is not shown to avoid complication of the drawing. In FIGS. 20A to 20C, components similar to those shown in FIGS. 1A to 19C are given identical reference numerals and will not be described in detail.

As shown in FIGS. 20A to 20C, two or more IC elements 51 may be disposed in the resin package 62 in this embodiment. Such IC elements 51 may be an identical type of IC elements or may be different types of IC elements that differ from one another in outside shape or pad terminal count. As is understood from the drawings, a MCM in which multiple IC elements 51 are sealed in the state of bare chips by one resin package 62 is also manufactured using a method similar to the above-mentioned embodiment.

As shown in FIG. 20A, first, two IC elements 51 are mounted on the posts 40 in IC-fixing regions (die attach process). Next, the posts 40 disposed in regions other than the IC-fixing regions and the pad terminals of the IC elements 51 are coupled via the gold wires 53 or the like (wire bonding process). Then, as shown in FIGS. 20B and 20C, the IC elements 51, the gold wires 53, and the posts 40 are sealed using a thermosetting epoxy resin or the like (resin-sealing process). Subsequently, the resin 61 sealing the IC elements 51 is removed from the substrate (not shown), and is diced into individual resin packages 62 so that two IC elements 51 are collectively included in an identical package.

Thus, according to the method for manufacturing the semiconductor device 200 according to the second embodiment, the posts 40 can become any of die pads and outside terminals. Therefore, there is no need for preparing dedicated die pads or a lead frame, or a dedicated substrate (interposer, etc.) for each type of the IC element 51 when assembling a semiconductor device. This reduces the manufacturing cost. With regard to the configuration of the semiconductor device 200, the posts 40 serving as die pads or outside terminals are disposed in a distributed manner in the resin package 62, as in the first embodiment. Therefore, positions where water flocculates are distributed in the resin 62, whereby concentration of vapor pressure is reduced. This suppresses a rapture of the resin package 62 in a test involving moisture absorption and heating, thereby enhancing the reliability of the semiconductor device.

In this embodiment, as shown in FIG. 20A, the posts 40 in regions other than the IC-fixing regions may be used as relay terminals for the gold wires 53. Specifically, a post 40a coupled to the pad terminal of the IC element 51 via a gold wire 53a may be coupled to another post 40b via a gold wire 53b. According to this method, the pad terminal of the IC element 51 can be drawn out to an arbitrary position without changing the positions in which the posts 40 are disposed. Therefore, the outside terminals of the semiconductor device 200 can substantially be changed. As a result, for example, the general versatility of the wiring board 50 shown in FIG. 7 is further enhanced. Also, as shown in FIG. 20A, both the pad terminals of the IC elements 51 may be electrically coupled via the gold wires 53 and the posts 40. According to this method, flexibility in design of the semiconductor device is further enhanced.

In the second embodiment, the gold wire 53a corresponds to a "first conductive material" in the invention, the post 40a to a "third metal post," the gold wire 53b to a "second conductive material," and the post 40b to a "fourth metal post."

What is claimed is:

1. A semiconductor device manufacturing method comprising:
   (a) bonding a first surface of a metal plate to a substrate;
   (b) forming a plurality of metal posts that are arranged in vertical and lateral directions in a plan view and include a first metal post and a second metal post, by partially etching the metal plate bonded to the substrate from a second surface of the metal plate;
   (c) fixing an integrated circuit element to the second surface of the first metal post;
   (d) coupling the second metal post and a pad terminal of the integrated circuit element via a conductive material;
   (e) resin-sealing the integrated circuit element, the metal posts, and the conductive material by providing a resin onto the substrate;
   (f) removing the substrate from the resin and the first surfaces of the metal posts sealed using the resin; and
   (g) forming the metal posts partway by partially half-etching the metal plate from the first surface prior to the bonding of the first surface of the metal plate, wherein
   in the forming of the plurality of the metal posts, the metal plate is penetrated by etching the half-etched metal plate from the second surface.

2. The semiconductor device manufacturing method according to claim 1, further comprising
   (h) forming a plated layer for solder joint on the first surface of the metal plate on which the metal posts are formed partway, prior to the bonding of the first surface of the metal plate.

3. The semiconductor device manufacturing method according to claim 1, wherein
   in the fixing of the integrated circuit, the integrated circuit element is mounted in a plurality of units side by side in a plan view on the second surface of the first metal post,
   in the coupling the second metal post and a pad terminal of the integrated circuit element, the pad terminals of the integrated circuit elements and the second metal post are coupled via the conductive material, and
   in the resin-sealing of the integrated circuit element, the integrated circuit elements, the metal posts, and the conductive material are collectively sealed using the resin, further comprising
   (i) dicing the resin so that the integrated circuit elements are contained in a resin package, after the resin-sealing of the integrated circuit element.

4. The semiconductor device manufacturing method according to claim 1, wherein
   the second metal post includes a third metal post and a fourth metal post,
   the conductive material includes a first conductive material and a second conductive material, and in the coupling the second metal post and a pad terminal of the integrated circuit element, the pad terminal of the integrated circuit element and the third metal post are coupled via the first conductive material and the third metal post and the fourth metal post are coupled via the second conductive material.

5. The semiconductor device manufacturing method according to claim 1, wherein
   in the forming of the plurality of the metal post, the metal posts are all formed to have identical shapes and identical sizes.

* * * * *